(12) United States Patent
Nakamura

(10) Patent No.: US 7,719,053 B2
(45) Date of Patent: May 18, 2010

(54) SEMICONDUCTOR DEVICE HAVING INCREASED GATE-SOURCE CAPACITY PROVIDED BY PROTRUDING ELECTRODE DISPOSED BETWEEN GATE ELECTRODES FORMED IN A TRENCH

(75) Inventor: Kazutoshi Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 11/608,538

(22) Filed: Dec. 8, 2006

(65) Prior Publication Data

US 2007/0138547 A1 Jun. 21, 2007

(30) Foreign Application Priority Data

Dec. 9, 2005 (JP) .............................. 2005-356109

(51) Int. Cl.
 *H01L 23/62* (2006.01)
(52) U.S. Cl. ................ 257/330; 257/333; 257/E27.091
(58) Field of Classification Search ................. 257/330, 257/333, E27.091
See application file for complete search history.

(56) References Cited

U.S. PATENT DOCUMENTS

| 7,005,353 | B2 | 2/2006 | Kocon et al. |
| 7,408,223 | B2 * | 8/2008 | Hueting ....................... 257/328 |
| 2003/0173619 | A1 * | 9/2003 | Feldtkeller et al. .......... 257/330 |
| 2005/0001264 | A1 | 1/2005 | Ono et al. |
| 2005/0167742 | A1 | 8/2005 | Challa et al. |

FOREIGN PATENT DOCUMENTS

JP 2004-327598 11/2004

\* cited by examiner

*Primary Examiner*—Phat X Cao
(74) *Attorney, Agent, or Firm*—Oblon, Spivak, McClelland, Maier & Neustadt, L.L.P.

(57) ABSTRACT

A semiconductor device comprises a semiconductor region of the first conduction type. A first main electrode is connected to the semiconductor region. A base region of the second conduction type is formed on the semiconductor region. A diffused region of the first conduction type is formed on the base region. A second main electrode is connected to the diffused region and the base region. A first trench is formed extending from a surface of the diffused region to the semiconductor region. A second trench is formed from the first trench deeper than the first trench. A gate electrode is formed on a side of the first trench via a first insulator film. A protruded electrode is formed in the second trench via a second insulator film as protruded lower than the gate electrode.

9 Claims, 11 Drawing Sheets

SEMICONDUCTOR DEVICE HAVING INCREASED GATE-SOURCE CAPACITY PROVIDED BY PROTRUDING ELECTRODE DISPOSED BETWEEN GATE ELECTRODES FORMED IN A TRENCH

CROSS REFERENCE TO RELATED APPLICATION

This application is based on and claims the benefit of priority from the prior Japanese Patent Application No. 2005-356109, filed on Dec. 9, 2005, the entire contents of which are incorporated herein by reference.

BACKGROUND OF THE INVENTION

1. Field of the Invention

The present invention relates to a semiconductor device, which is used as a fast switching device or a power device, and method of manufacturing the same.

2. Description of the Related Art

The voltage of power supply used in a CPU for a computer or the like has been lowered gradually. In accordance with this tendency, synchronous buck converter has been employed heavily. In a synchronous commutating power source, an elevation of the operating frequency increases the voltage variation rate dV/dt to the potential at a node between a high-side element and a low-side element. Consequently, even though a switching element at the low-side element is set at the off state, the off state can not be retained and is turned into the on state due to dV/dt of the drain voltage because of the gate-drain capacity in the switching element. This is known as the self turn-on phenomenon.

To prevent occurrences of the self turn-on phenomenon, a reduction in gate resistance in the switching element is important as well as a reduction in ratio (hereinafter, Cgd/Cgs) of the gate-drain capacity (hereinafter, Cgd) to the gate-source capacity (hereinafter, Cgs). In a power source for electronic instruments such as a note PC, a ratio of the output voltage to the input voltage is small, and the duration of the low-side element being kept on is longer than the duration of the high-side element being kept on. Therefore, a low on-resistance is also important.

To achieve such the property, structures of semiconductor devices as various switching elements have been considered. For example, the invention disclosed in Patent Document (JP 2004/327598 A) teaches two gate electrodes in a trench, and a source electrode formed as sandwiched therebetween via an insulator film. In this invention, the overlapped area between gate-drain is minimized to reduce the gate-drain capacity. If the overlapped area between the gate electrode and an n⁻-type epitaxial layer is small, the effect of depleting from the gate electrode toward the n⁻-type epitaxial layer can not be exerted. Accordingly, it is not configured to reduce the on resistance sufficiently.

SUMMARY OF THE INVENTION

According to one aspect of the present invention, a semiconductor device comprises a semiconductor region of the first conduction type; a first main electrode connected to the semiconductor region; a base region of the second conduction type formed on the semiconductor region; a diffused region of the first conduction type formed on the base region; a second main electrode connected to the diffused region and the base region; a first trench formed extending from a surface of the diffused region to the semiconductor region; a second trench formed from the first trench much deeper than the first trench; a gate electrode formed on a side of the first trench via a first insulator film; and a protruded electrode formed in the second trench via a second insulator film as protruded downward lower than the gate electrode.

According to one aspect of the present invention, a method of manufacturing a semiconductor device comprises forming on a semiconductor region of the first conduction type a base region of the second conduction type; forming a first trench through the base region to a depth reaching the semiconductor region; thermally oxidizing the entire surfaces of the first trench and the base region to form an insulator film; depositing a conductive film over a surface of the insulator film; anisotropically etching the conductive film to leave the conductive film only on a side of the first trench; forming a second trench in a central region at the bottom of the first trench, the second trench extending much deeper than the first trench; thermally oxidizing the surfaces of the conductive film left after the anisotropic etching and the second trench to form an insulator film; and depositing a conductive film over a surface of the insulator film formed in the second trench.

DETAILED DESCRIPTION OF THE INVENTION

Embodiments of the present invention will now be described below with reference to the drawings.

First Embodiment

Figure 1:
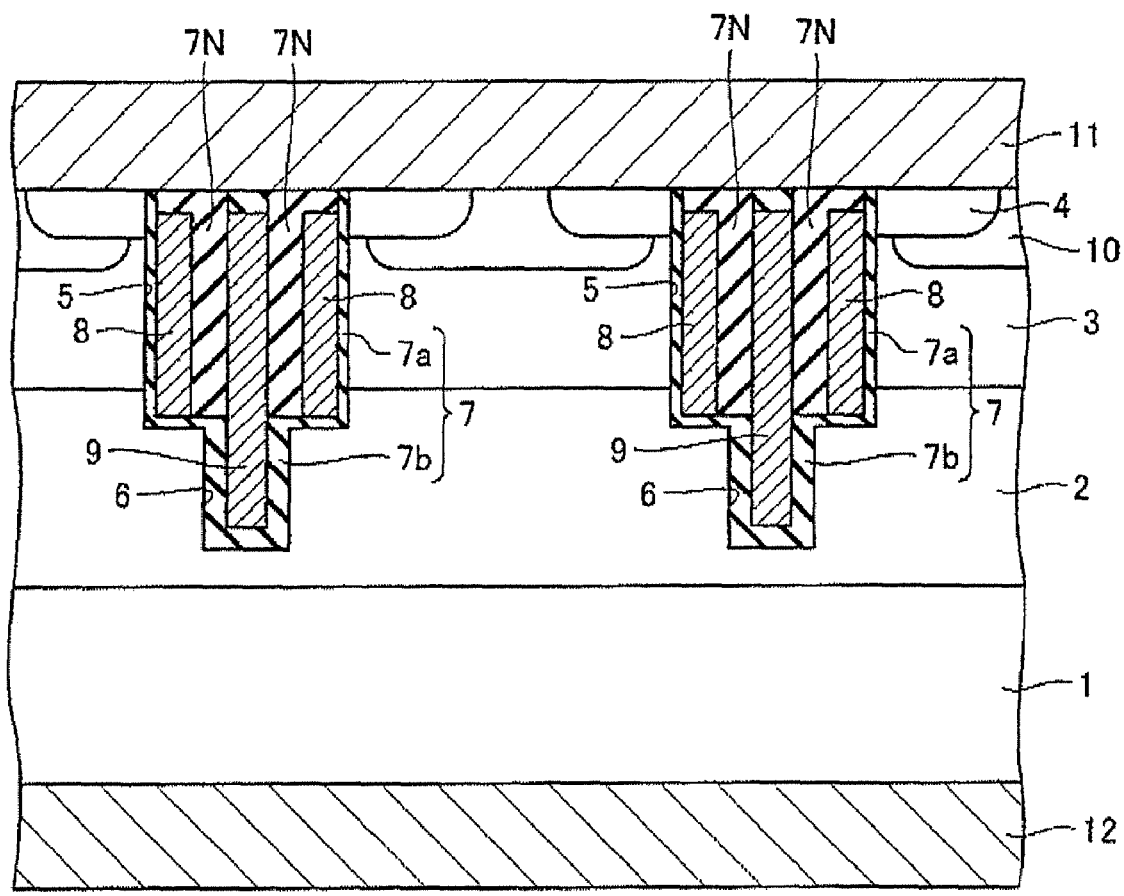
FIG. 1 is a cross-sectional view of a semiconductor device according to a first embodiment of the present invention.

FIG. 1 is a cross-sectional view illustrative of a structure of a semiconductor device, or MOSFET, according to a first embodiment of the present invention. The semiconductor device according to the first embodiment mainly comprises an $N^+$-type semiconductor substrate 1 an $N^-$-type drift layer 2 formed over the $N^+$-type semiconductor substrate 1, a P-type base layer 3 formed over the $N^-$-type drift layer 2, and an $N^+$-type source layer 4 formed in a surface of the P-type base layer 3.

A first trench 5 is formed from a surface of the $N^+$-type source layer 4 through the P-type base layer 3 to a certain depth in the $N^-$-type drift layer 2. A second trench 6 is formed near the center of the bottom of the first trench 5 much deeper than the first trench 5 to a certain depth in the $N^-$-type drift layer 2.

An insulator film 7 is formed on sides of the first trench 5. A pair of gate electrodes 8, 8 are formed on the sides of the first trench 5 as spaced from each other with the insulator film 7 interposed therebetween. An insulator film 7 is formed on the bottom of the second trench 6 and sides of the pair of gate electrodes 8, 8. A protruded electrode 9 is provided as protruded downward lower than the bottoms of the gate electrodes 8, 8 with the insulator film 7 interposed therebetween. An insulator film 7 is formed above the pair of gate electrodes 8, 8 and the protruded electrode 9.

The above insulator films 7 have different thicknesses in accordance with the locations where they are formed. In comparison with the insulator film 7a on the sides of the gate electrode 8 facing the P-type base layer 3 and the $N^-$-type drift layer 2, the insulator film 7b on the sides of the protruded electrode 9 facing the $N^-$-type drift layer 2 is formed thicker. The insulator film 7 between the gate electrode 8 and the protrude electrode 9 is composed of a nitride film 7N.

On the surface of the P-type base layer 3, a $P^+$-type contact layer 10 is provided adjacent to the $N^+$-type source layer 4. A source electrode 11 is formed of a top metal brought into contact with the $P^+$-type contact layer 10 and the $N^+$-type source layer 4. On the other hand, a drain electrode 12 is formed on the rear surface of the $N^+$-type semiconductor substrate 1. The source electrode 11 is connected to the protruded electrode 9, for example, through a contact provided in a terminal region outside a device region.

In the semiconductor device according to the first embodiment of the present invention having such the structure, the protruded electrode 9 is provided between the pair of gate electrodes 8, 8 as protruded downward lower than the gate electrode 8 and electrically connected to the source electrode 11 to increase the gate-source capacity Cgs. The protruded electrode 9 connected to the source electrode 11 forms a depletion layer in the $N^-$-type drift layer 2 widely. Accordingly, it is possible to increase the impurity concentration in the $N^-$-type drift layer 2 to reduce the on resistance. Therefore, even if the protrusion of the first trench 5 from the P-type base layer 3 into the $N^-$-type drift layer 2 is made small, the gate-source capacity Cgs can be increased to improve Cgd/Cgs and achieve a lower on resistance. As the insulator film 7b is formed thicker than the insulator film 7a, the voltage applied across drain-source in the off state can be shared by the insulator film 7b to relief the electric field applied across the $N^-$-type drift layer 2. In other words, it is possible to enhance the breakdown voltage.

The protruded electrode 9 is electrically connected to the source electrode 11 in the first embodiment though it may also be connected to the gate electrode 8 if only a low on resistance is taken into a serious view. The connection to the gate electrode 8 makes it possible to form an electron accumulation layer in an interface with the first trench 5 to increase the carrier concentration in the $N^-$-type drift layer 2 when the device is turned on.

An example of process steps of manufacturing the semiconductor device according to the first embodiment is described next with reference to FIGS. 2-10.

Figure 2:
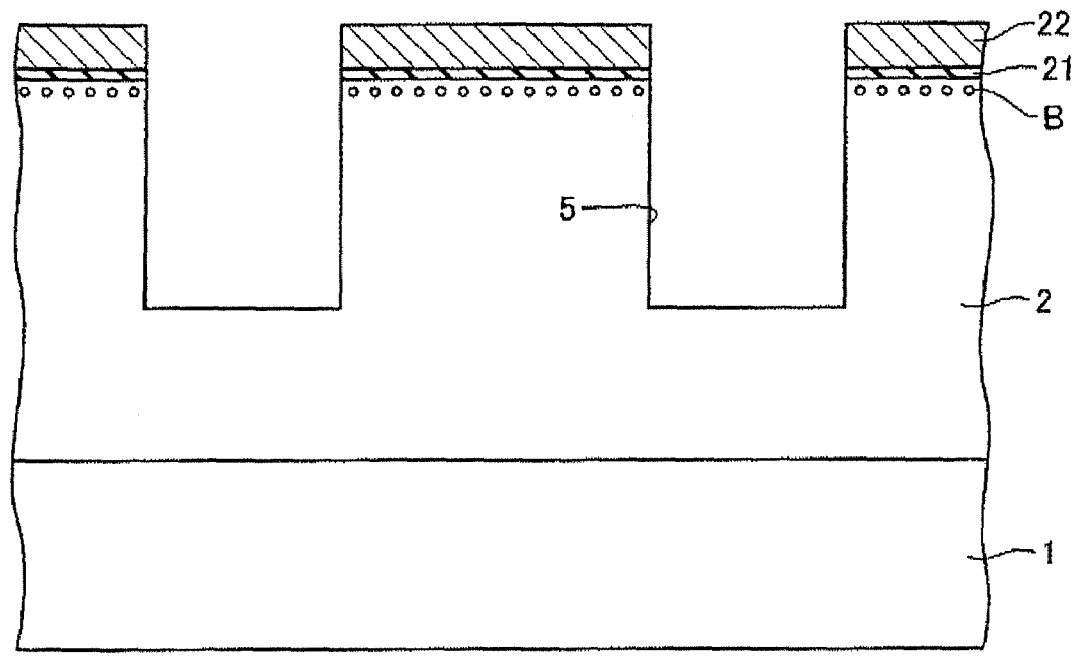
FIG. 2 is a process step diagram of manufacturing the semiconductor device according to the first embodiment of the present invention.

First, as shown in FIG. 2, the $N^-$-type drift layer 2 is epitaxially grown from the surface of the $N^+$-type semiconductor substrate 1. On the surface of the drift layer, a buffer oxide film 21 is formed to serve as a buffer layer for ion implantation. Ions of boron (B) are implanted into the $N^-$-type drift layer 2 in the vicinity of the surface, and then the buffer oxide film 21 and a resist film 22 are formed in a certain region. Thereafter, processes of photolithography and etching are applied to form the first trench 5.

Figure 3:
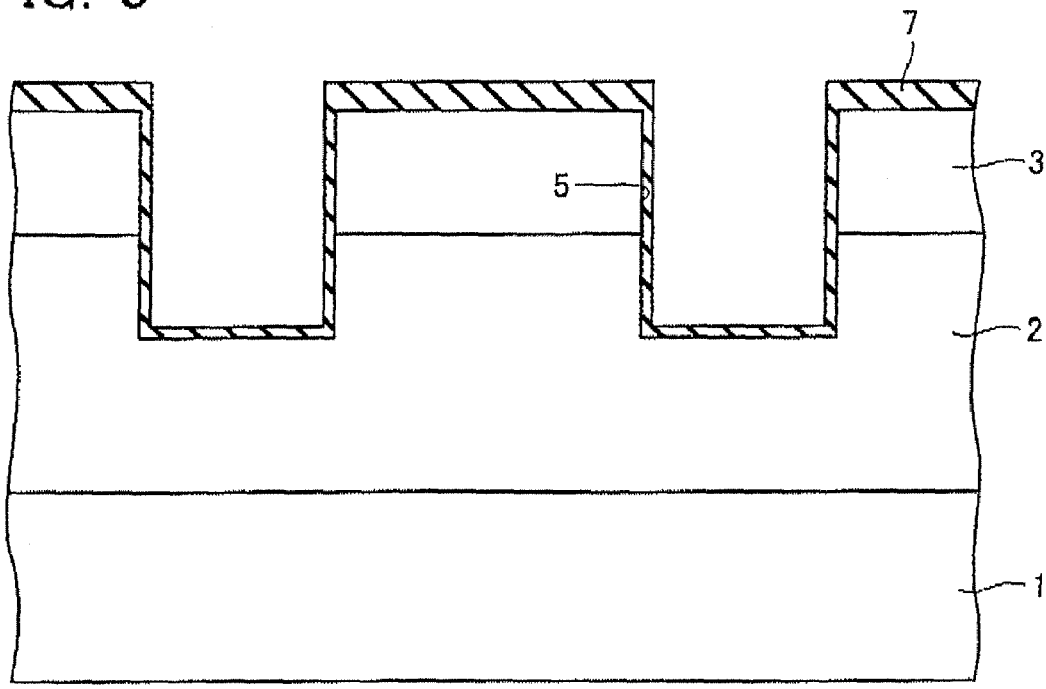
FIG. 3 is a process step diagram of manufacturing the semiconductor device according to the first embodiment of the present invention.
Figure 4A:
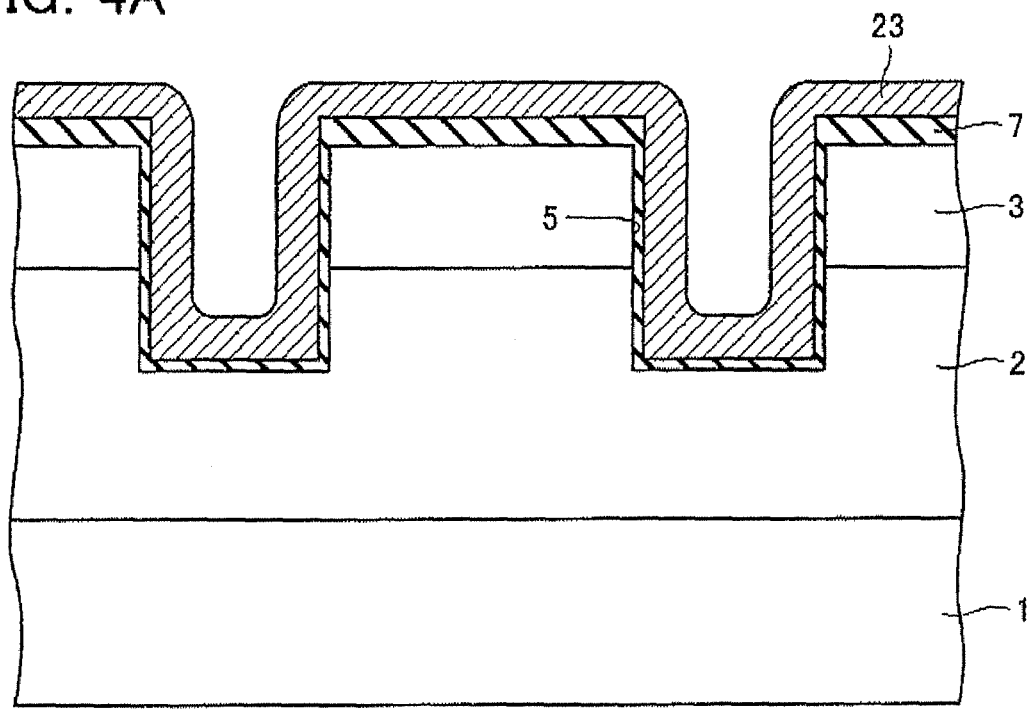
FIG. 4A is a process step diagram of manufacturing the semiconductor device according to the first embodiment of the present invention.

Next, as shown in FIG. 3, ashing is executed to remove the resist film 22, and then thermal oxidation is applied to form an insulator film 7 over the surfaces of the $N^-$-type drift layer 2 and the P-type base layer 3. With this process of thermal oxidation, B localized in the vicinity of the surface is diffused in depth to form the P-type base layer 3. Then, as shown in FIG. 4A, a process of CVD is applied to deposit polysilicon 23 along walls in the first trench 5.

Figure 4B:
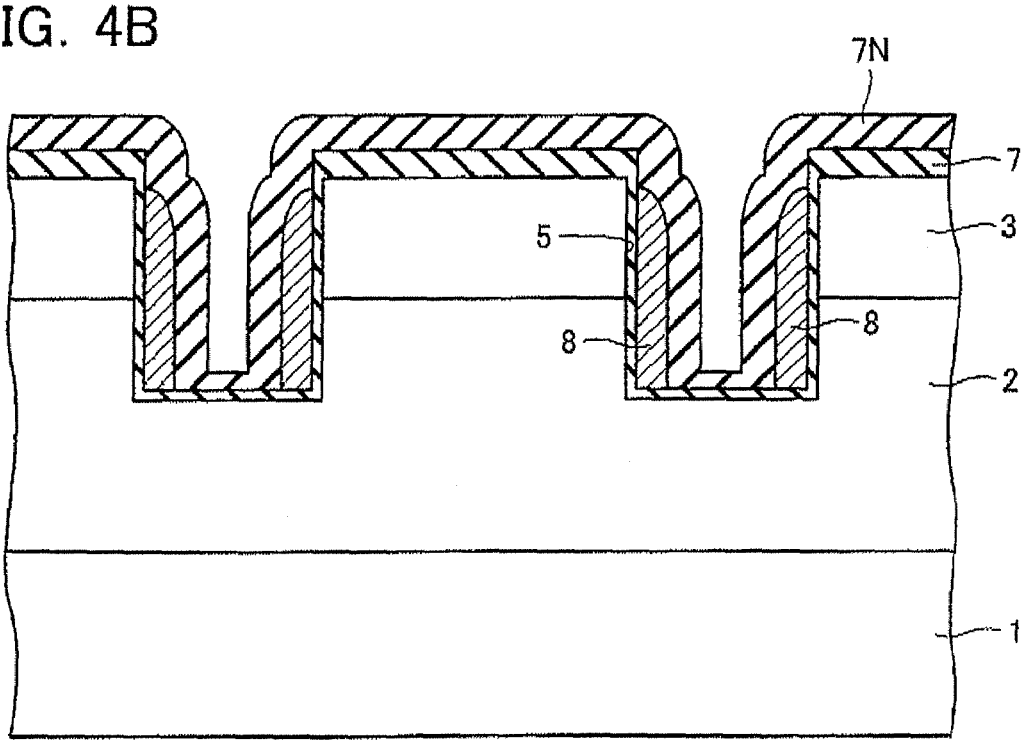
FIG. 4B is a process step diagram of manufacturing the semiconductor device according to the first embodiment of the present invention.

Next, as shown in FIG. 4B, a process of CVD is applied to form a nitride film 7N over the entire surface of the polysilicon 23 after anisotropically etching the polysilicon film 23. The polisilicon 23 which remained under the nitride film 7N becomes gate electrode 8.

Figure 4C:
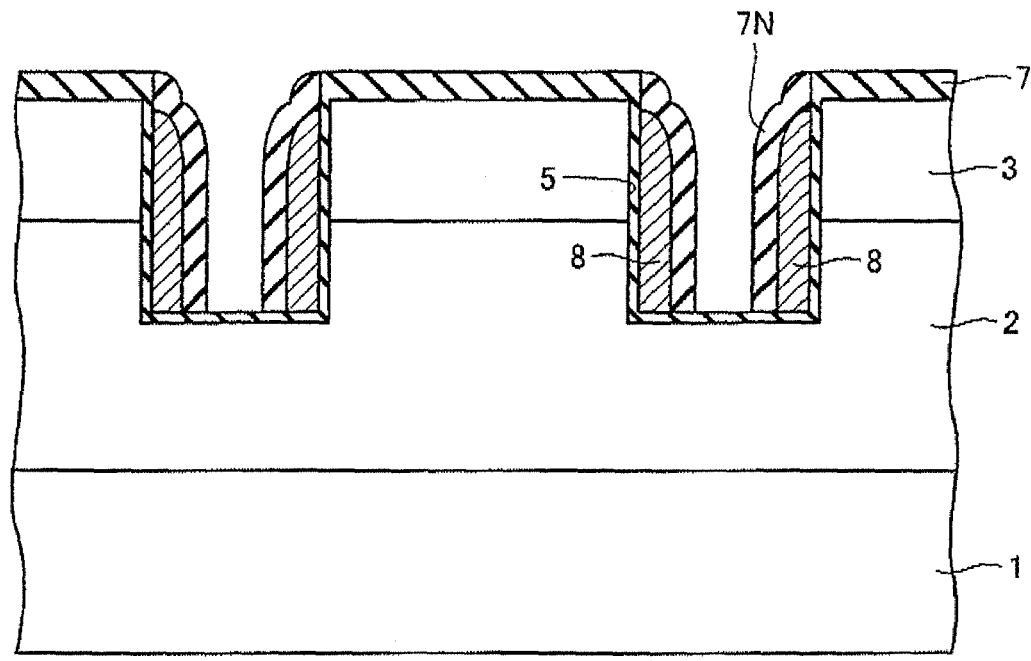
FIG. 4C is a process step diagram of manufacturing the semiconductor device according to the first embodiment of the present invention.

Then, as shown in FIG. 4C, a process of reactive ion etching (hereinafter, RIE) applied to anisotropically etch the nitride film 7N so that the nitride film 7N is left only on the gate electrode 8.

Figure 5:
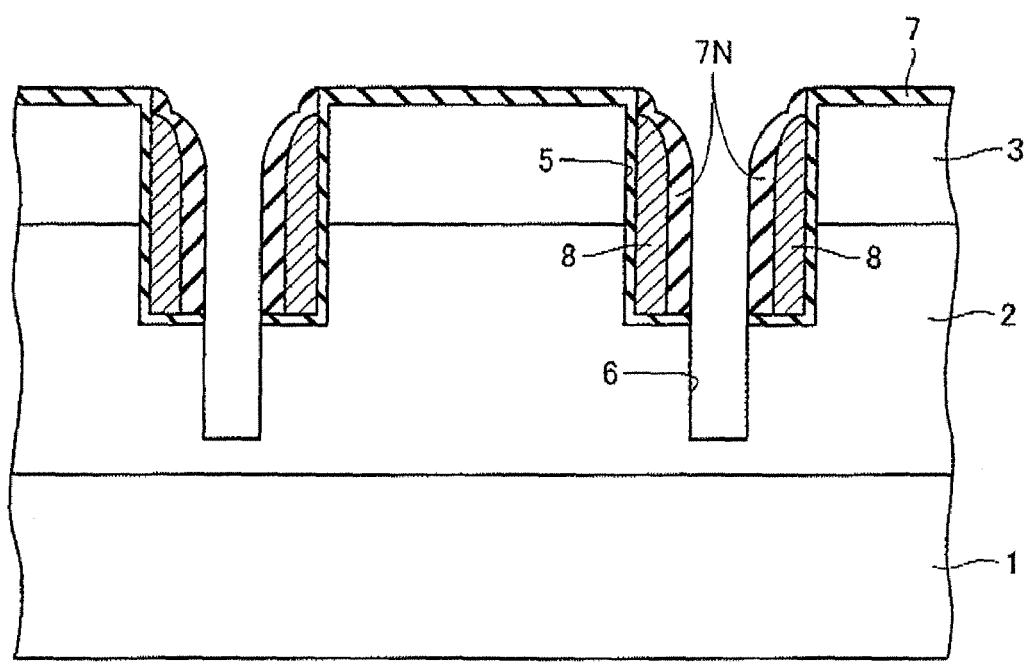
FIG. 5 is a process step diagram of manufacturing the semiconductor device according to the first embodiment of the present invention.
Figure 6:
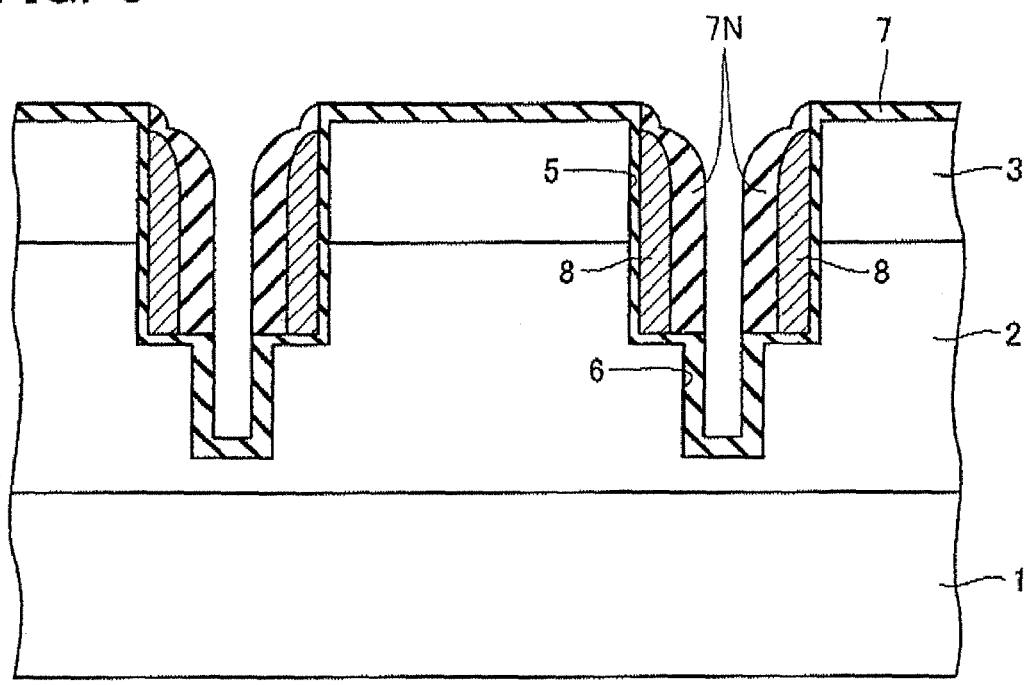
FIG. 6 is a process step diagram of manufacturing the semiconductor device according to the first embodiment of the present invention.

After anisotoropically etching the nitride film 7N, as shown in FIG. 5, a process of RIE is applied to anisotropically etch the insulator film 7 on bottom face of the first trench 5. Protecting the trench walls with the nitride film 7N, a much deeper second trench 6 is formed in the vicinity of the center of the first trench 5 so as not to reach the $N^+$-type semiconductor substrate 1. Then, as shown in FIG. 6, the surfaces of the $N^-$-type drift layer 2 is thermally oxidized to form the insulator film 7. If the insulator film 7 is sufficiently-thick, the second trench 6 may contact the $N^+$-type semiconductor substrate 1.

Figure 7:
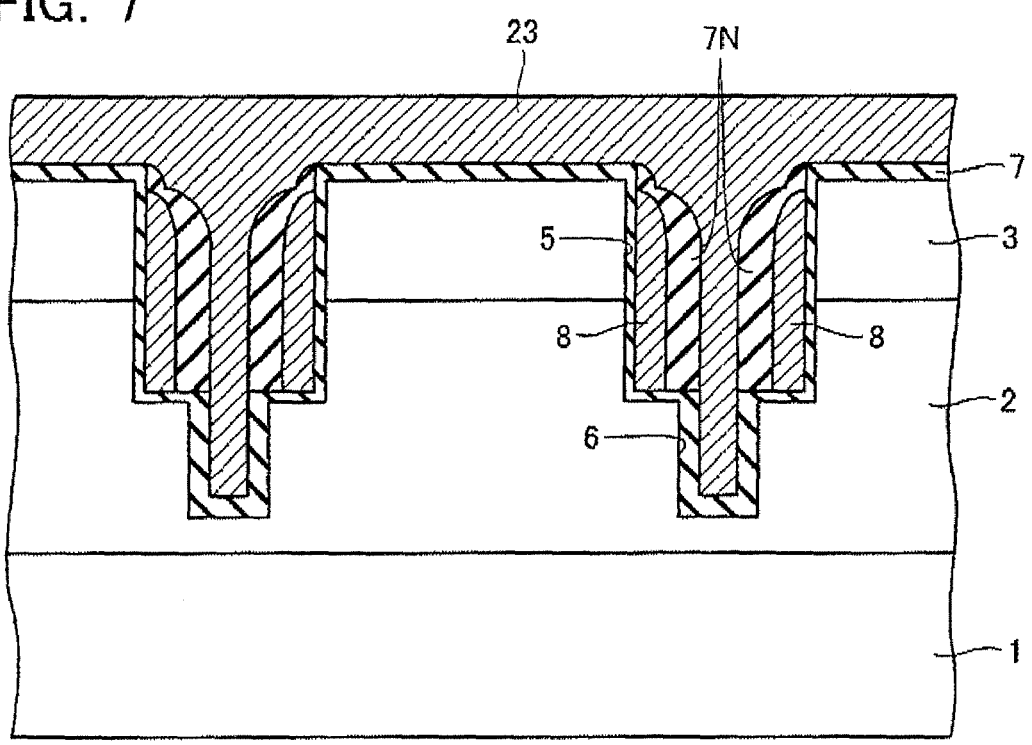
FIG. 7 is a process step diagram of manufacturing the semiconductor device according to the first embodiment of the present invention.

Next, as shown in FIG. 7, a process of CVD is applied to deposit polysilicon 23 over the entire surfaces of the gate electrodes 8 formed on the sides in the first trench 5 and the second trench 6.

Figure 8:
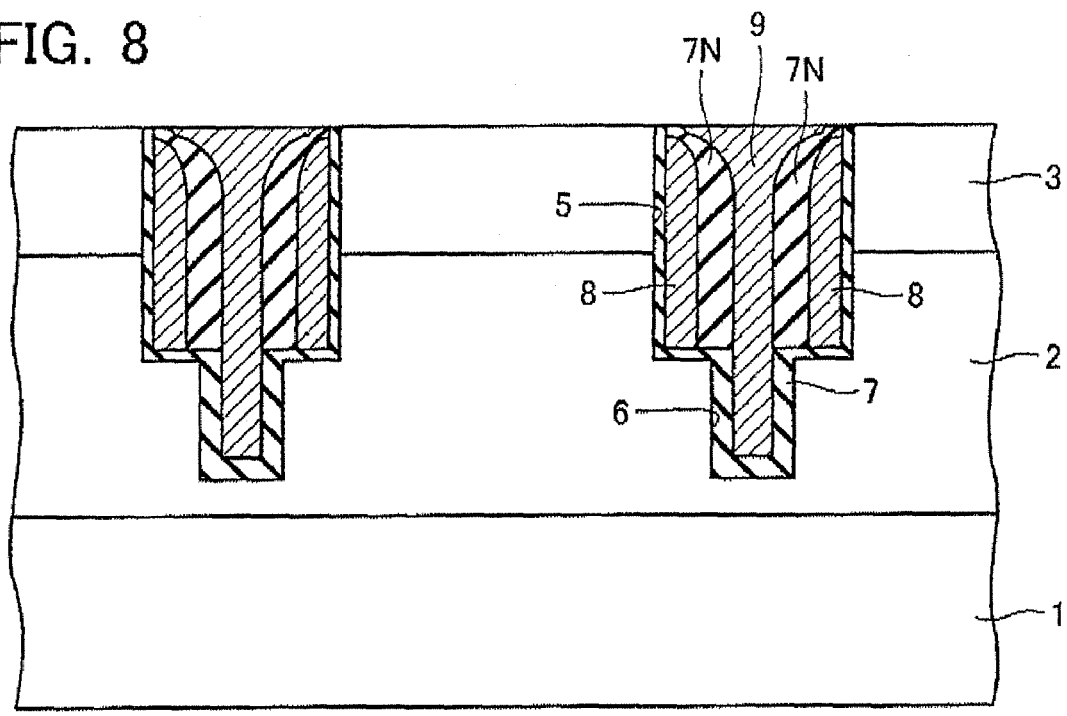
FIG. 8 is a process step diagram of manufacturing the semiconductor device according to the first embodiment of the present invention.

After deposition of the polysilicon 23, as shown in FIG. 8, a process of CMP (Chemical Mechanical Polishing) or etching back is applied to the surface to leave the polysilicon only inside the trenches. The insulator film on the surface is removed by RIE or wet etching.

Figure 9:
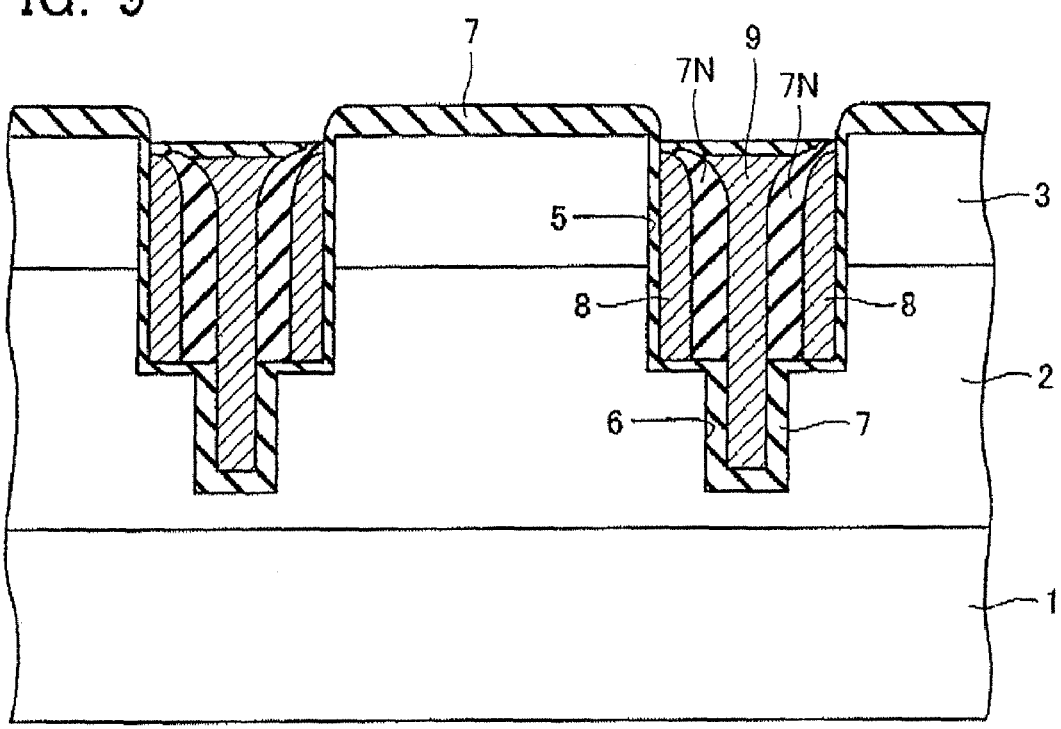
FIG. 9 is a process step diagram of manufacturing the semiconductor device according to the first embodiment of the present invention.

Next, as shown in FIG. 9, a process of CVD is applied to deposit the insulator film 7 over the surfaces of the gate electrodes 8 and the protruded electrode 9.

Figure 10:
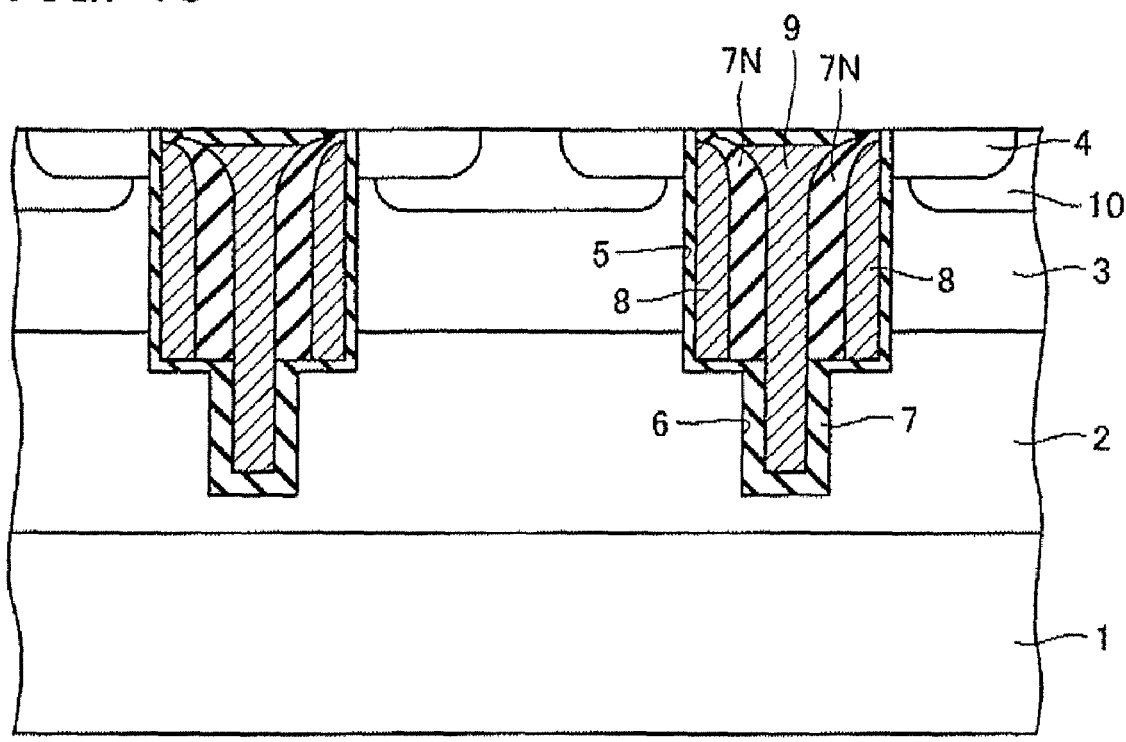
FIG. 10 is a process step diagram of manufacturing the semiconductor device according to the first embodiment of the present invention.

Then, as shown in FIG. 10, ions of a p-type impurity such as boron (B) are implanted to form the $P^+$-type contact layer 10. Thereafter, ions of an n-type impurity such as phosphorous (P) or arsenic (As) are implanted to selectively form the $N^-$-type source layer 4. The P-type base layer 3 is diffused further in depth through the ion implantation in this step.

Finally, the source electrode 11 is formed on the $P^+$-type contact layer 10 and the $N^-$-type source layer 4. Further, the drain electrode 12 is formed on the rear surface of the $N^+$-type semiconductor substrate 1 to complete the semiconductor device having the MOSFET structure shown in FIG. 1.

A synchronous buck DC-DC converter 100 including the semiconductor device according to one embodiment of the present invention is described next with reference to FIG. 11. This DC-DC converter 100 includes a MOSFET (controlling element) 101 and a MOSFET (synchronous commutating element) 102 both having the structure according to the N-channel semiconductor device of the present invention.

The MOSFET (synchronous commutating element) 102 is connected in parallel with a low-$V_F$ SBD (Schottky Barrier Diode) 103. The MOSFET's 101 and 102 have gates, which are connected to a drive IC chip 104 for controlling the gate voltages.

The gates of the MOSFET's 101 and 102 are normally driven under PWM control. The PWM control is a controlling scheme for stabilizing the DC output voltage from a switching power source. This scheme changes the ratio of the ON duration to the OFF duration of the switching transistors (MOSFET's 101 and 102) to control the output voltage. The ON duration is elongated when the output voltage lowers and shortened when it elevates. Thus, a constant voltage can be kept always.

The MOSFET 102 is connected in parallel with an LC circuit including an inductor 105 and a condenser 106. A load such as CPU 107 is connected across the output of the DC-DC converter 100.

Figure 11:
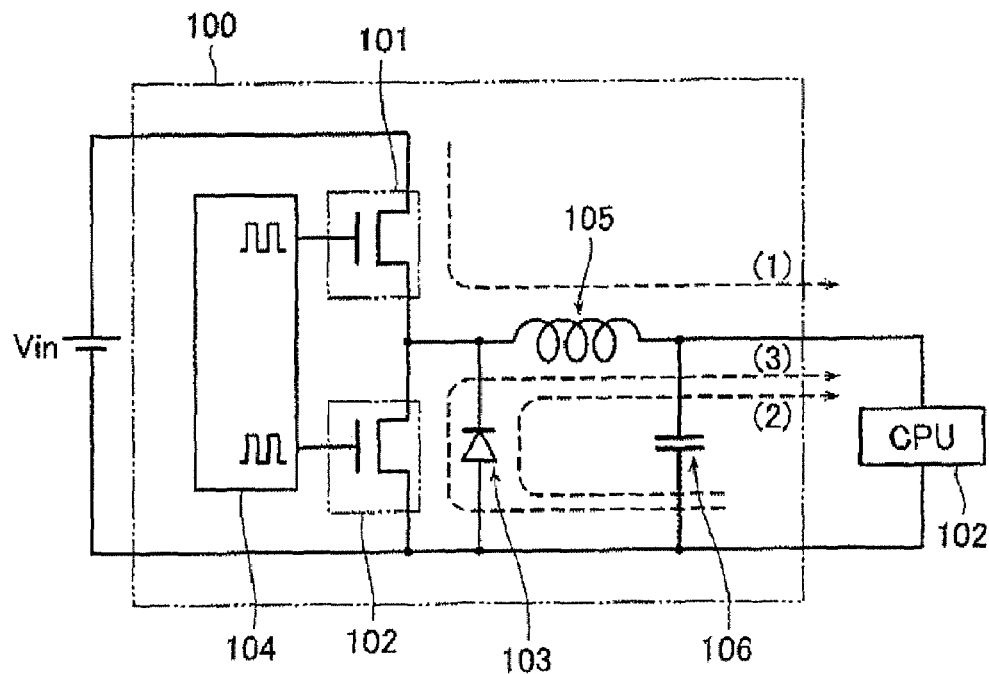
FIG. 11 is a schematic diagram of a DC-DC converter.
Figure 12:
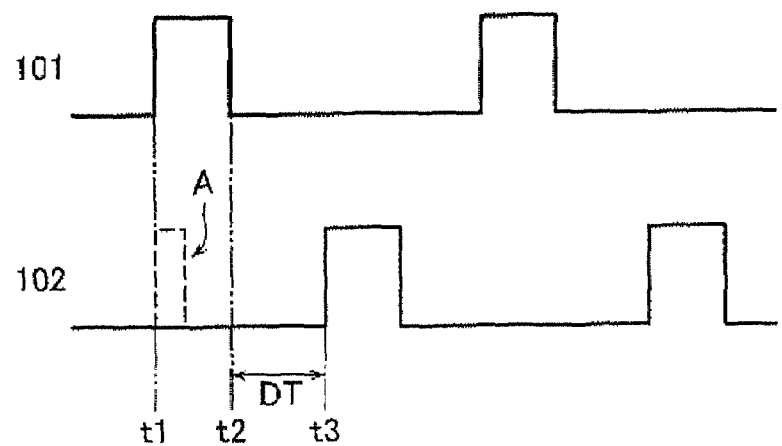
FIG. 12 is a timing chart of signals put into MOSFET's 101 and 102 of FIG. 11.

As shown in FIGS. 11 and 12, the MOSFET 101 is turned on at the time t1 while the MOSFET 102 is kept off. As a result, an input voltage Vin allows a current indicated with the arrow (1) to flow and the current is supplied via the inductor 105 to the CPU 107. Next, the MOSFET 101 is turned off at the time t2 to halt the supply of power to the CPU 107 under the input voltage Vin. Instead, the power accumulated in the inductor 105 allows a commutated current indicated with the arrow (2) to flow via the SBD 103 to feed power to the CPU 107.

After elapse of a certain dead time DT set to prevent a short-through current from flowing in the MOSFET 101 and the MOSFET 102, the MOSFET 102 is turned on at the time t3. The MOSFET 102 has a lower resistance than the SBD 103 has. Accordingly, the power accumulated in the inductor 105 allows a resultant commutated current to flow through not the SBD 103 but the MOSFET 102 as indicated with the arrow (3) to feed power to the CPU 107. The condenser 106 is employed to smooth the output voltage wavelength.

As described above, the current indicated with the arrow (2) flows through the SBD 103 at the time t2. The current flowing in the SBD 103 causes a voltage drop, which produces a loss in power fed to the CPU 107 correspondingly. The MOSFET 102 can reduce the voltage drop smaller than the SBD 103 does. Accordingly, after elapse of the certain dead time DT, the current flowing via the MOSFET 102 makes it possible to feed power to the CPU 107 efficiently.

In a conventional synchronous buck DC-DC converter, an increase in operating frequency results in a self turn-on phenomenon indicated with the symbol A. The use of the semiconductor device according to the present invention makes it possible to reduce Cgd/Cgs and also reduce the on resistance. Accordingly, even if the MOSFET 101 switches at a high speed, it is possible to prevent the self turn-on phenomenon from arising.

Second Embodiment

Figure 13A:
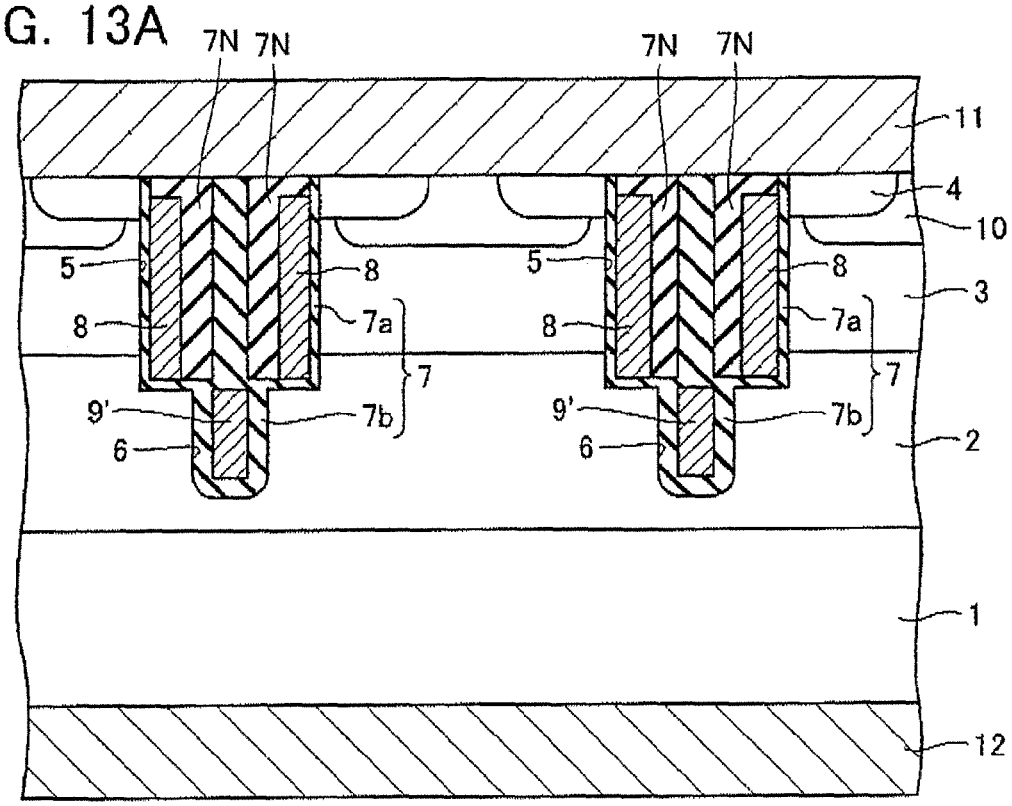
FIG. 13A is a cross-sectional view of a semiconductor device according to a second embodiment of the present invention.

A semiconductor device according to a second embodiment of the present invention is described with reference to FIG. 13. As shown in FIG. 13A, the semiconductor device according to the second embodiment of the present invention is different from the first embodiment in a protruded electrode 9'. The protruded electrode 9' is not formed at a depth opposite to the gate electrode 8 but is formed at a position much deeper than the depth where the gate electrode 8 is formed.

Figure 13B:
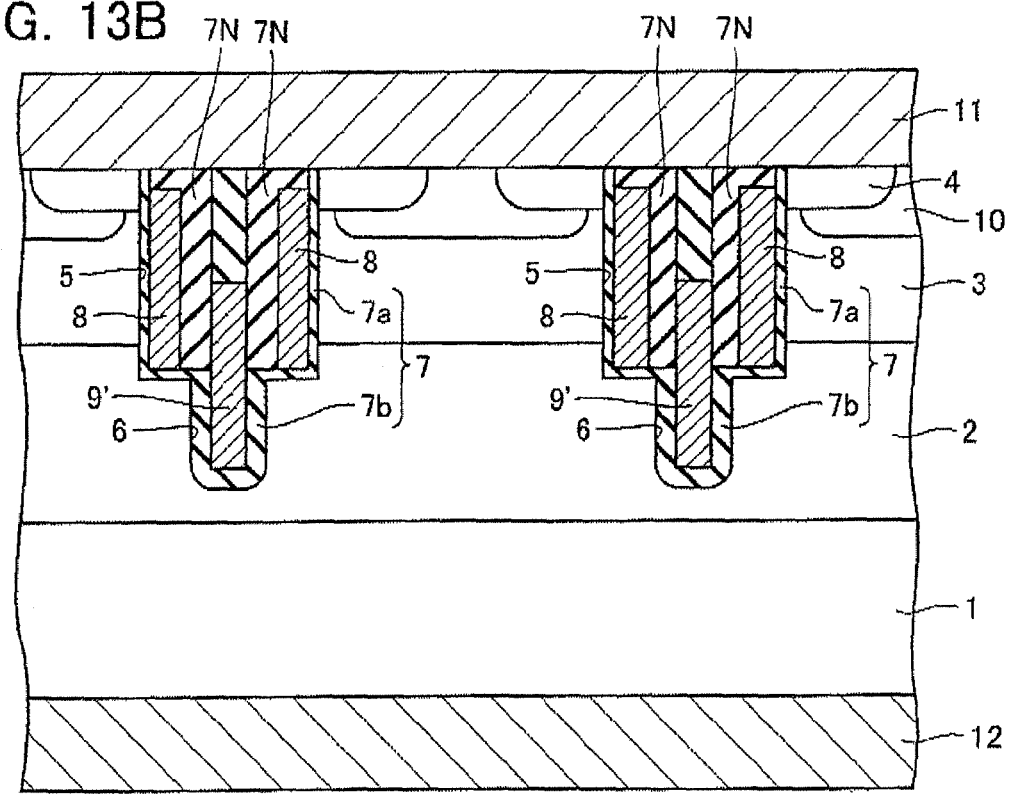
FIG. 13B is a cross-sectional view of a semiconductor device according to a second embodiment of the present invention.

When Cgd is small and Cgs is large but does not result in self turn-on, the capacity between the protruded electrode 9' and the gate electrode 8 increases the drive loss. Then, if the protruded electrode 9' is not formed on the surface opposite to the gate electrode 7 as in the second embodiment, it is possible to reduce Cgs and improve the on resistance only. As shown in FIG. 13B, if an area at which the protrude electrode 9' faces the gate electrode 8 is changed, it is possible to control Cgd/Cgs easily.

Third Embodiment

Figure 14:
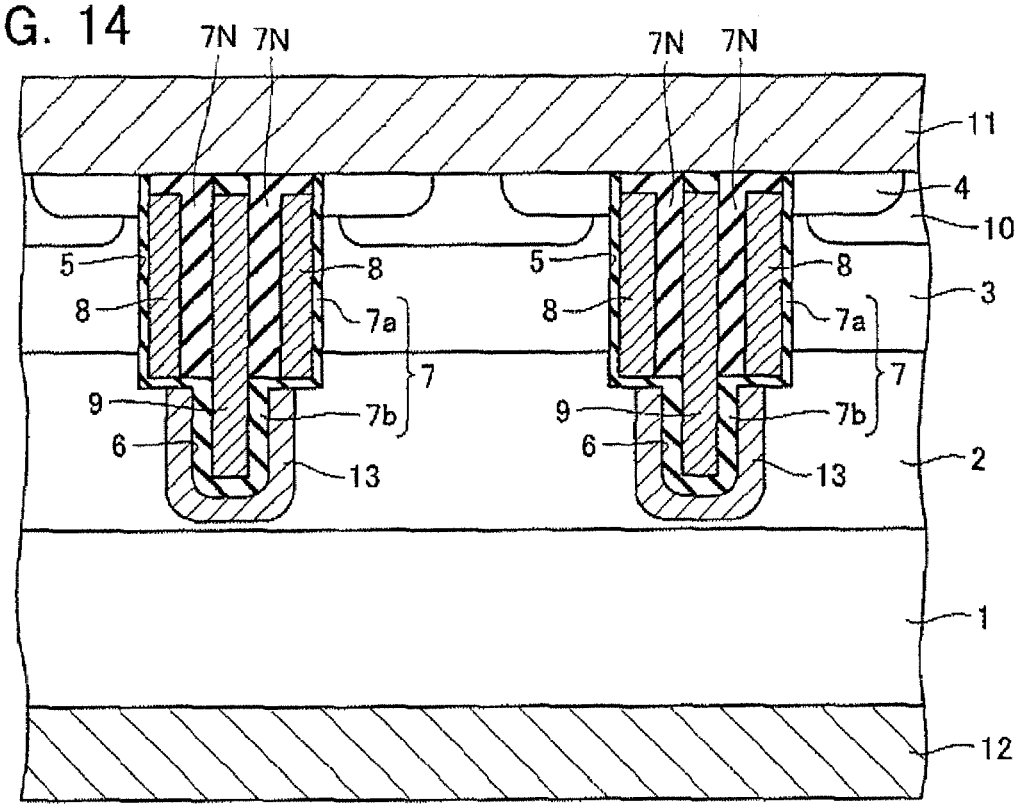
FIG. 14 is a cross-sectional view of a semiconductor device according to a third embodiment of the present invention.

A semiconductor device according to a third embodiment of the present invention is described with reference to FIG. 14. As shown in FIG. 14, the semiconductor device according to the third embodiment of the present invention is different from the first embodiment in an N-type semiconductor layer 13 having a high impurity concentration and provided in a region where the protruded electrode 9 faces the $N^-$-type drift layer 2.

The N-type semiconductor layer 13 is provided for the reason as described below. A terminal portion of the semiconductor device includes such a region that does not contain the first trench 5 and the second trench 6. When the impurity concentration is increased in the $N^-$-type drift layer 2, a depletion layer can extend in the device portion to enhance the breakdown voltage, effected from the protruded electrode 9. In contrast, the breakdown voltage is lowered in the terminal portion because the protruded electrode 9 is not provided therein Therefore, a locally increased impurity concentration in the vicinity of the location of the protruded electrode 9 and a lowered impurity concentration in the terminal can prevent the breakdown voltage from lowering.

Fourth Embodiment

Figure 15:
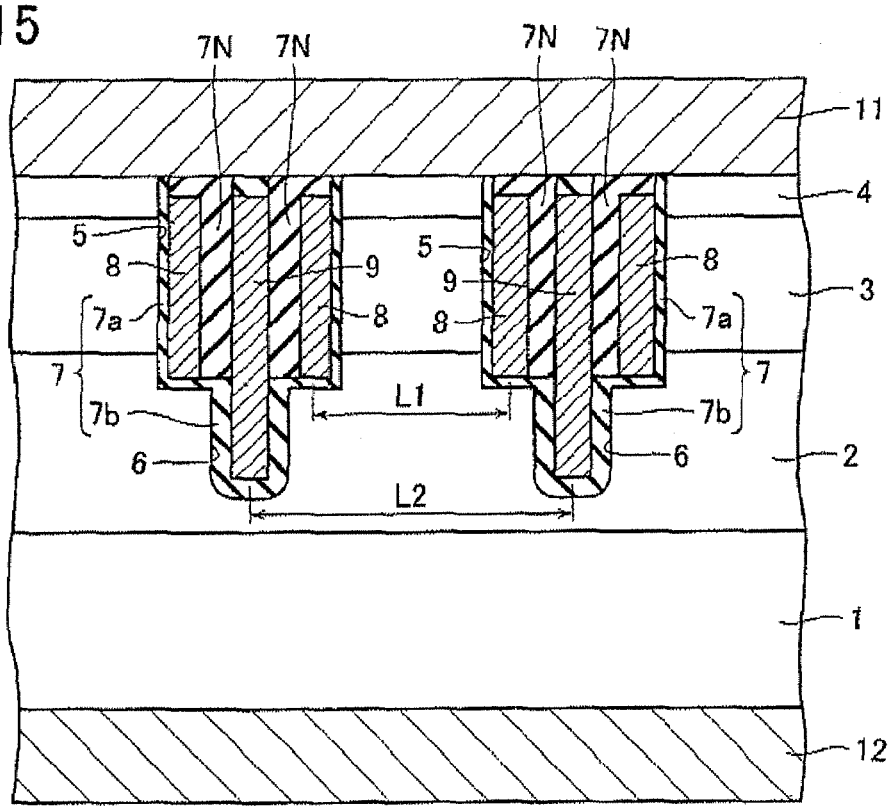
FIG. 15 is a cross-sectional view of a semiconductor device according to a fourth embodiment of the present invention.

A semiconductor device according to a fourth embodiment of the present invention is described with reference to FIG. 15. As shown in FIG. 15, the semiconductor device according to the fourth embodiment of the present invention has a distance L1 between adjacent first trenches 5 and a distance L2 between adjacent second trenches 6 both made shorter compared to the first through third embodiments. Such the structure relieves the vertical electric field across a channel and improves the mobility when the device is turned on. Therefore, an improved channel resistance can realize a low on resistance. The P+-type contact layer 10 is not formed in FIG. 15 though the P+-type contact layer 10 may be formed like in the structure of the first through third embodiments.

Fifth Embodiment

Figure 16:
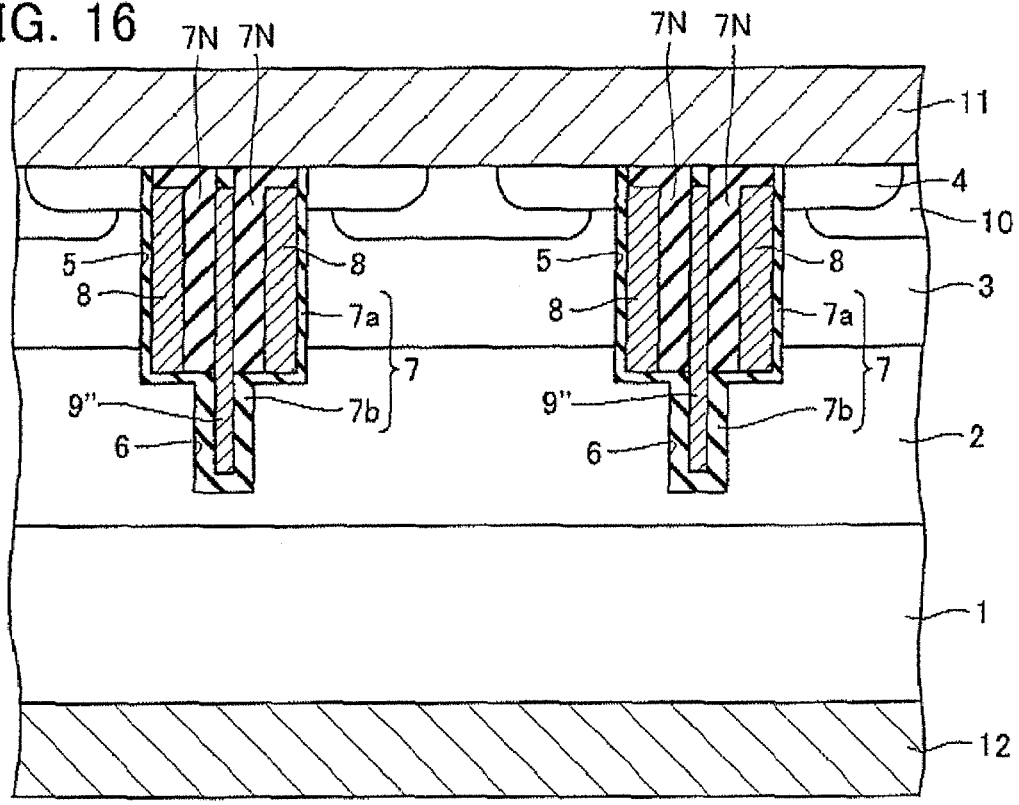
FIG. 16 is across-sectional view of a semiconductor device according to a fifth embodiment of the present invention.

A semiconductor device according to a fifth embodiment of the present invention is described with reference to FIG. 16. As shown in FIG. 16, the semiconductor device according to the fifth embodiment of the present invention is only different in structure of a protruded electrode 9" from the first embodiment. Specifically, the protruded electrode 9" has a cross-sectional area perpendicular to the direction of current flowing in a channel. The cross-sectional area is formed smaller than the gate electrode 8 to reduce the on resistance per unit area. In addition, the protruded electrode 9 is just used to fix a potential to the source potential and not to allow a charge/discharge current to flow therein like the gate electrode when the device is turned on/off. Therefore, a reduced cross-sectional area of the gate electrode increases the gate resistance and affects the switching speed. In contrast, a reduced cross-sectional area of the protruded electrode 9 hardly affects the switching speed.

Figure 17:
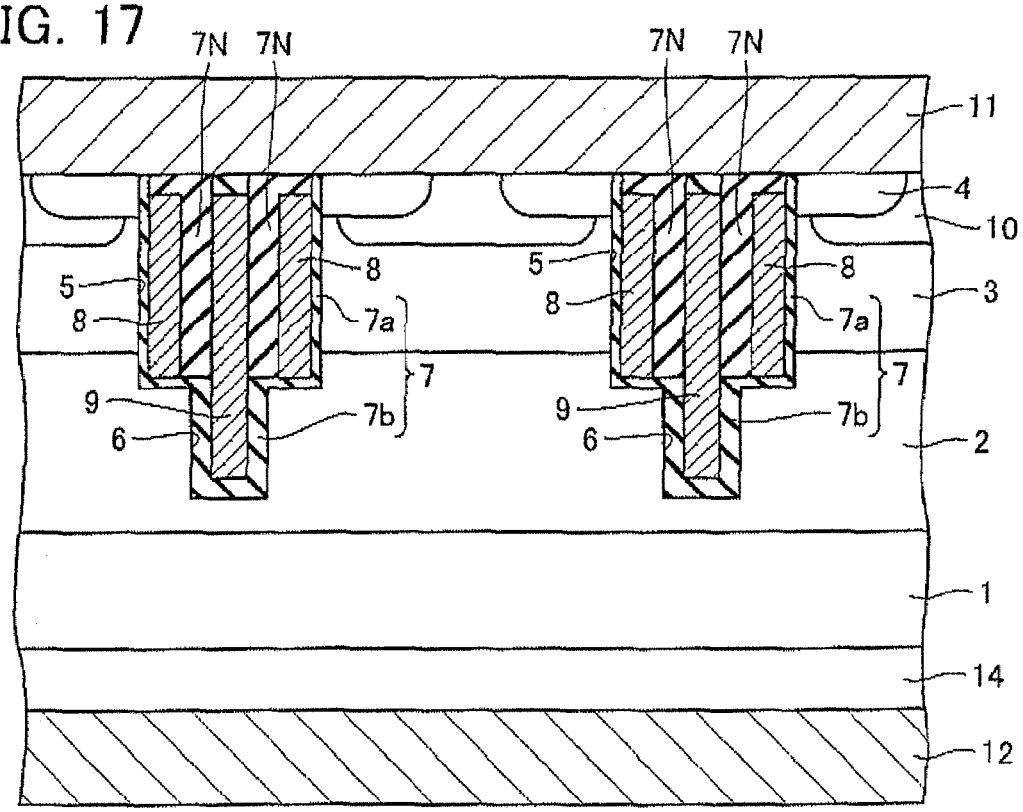
FIG. 17 is a cross-sectional view of a semiconductor device according to another embodiment of the present invention.

The embodiments of the invention have been described above though the present invention is not limited to these embodiments but rather may be given various modifications, additions and replacements without departing from the scope of the invention. For example, the above embodiments have been described as the first conduction type is the n-type and the second conduction type is the p-type. Alternatively, the first conduction type may be the p-type and the second conduction type may be the n-type to exert the same effect on similar implementation of the present invention. In addition, the present invention is also applicable to other power semiconductor elements such as an IGBT (Insulated Gate Bipolar Transistor) than the MOSFET. The IGBT in FIG. 17 almost has the same structure as that of the MOSFET in FIG. 1. Different from the MOSFET, the IGBT includes a P-type semiconductor layer 14 between the N+-type semiconductor substrate 1 and the drain layer 12.

What is claimed is:
1. A semiconductor device, comprising:
    a semiconductor region of a first conduction type;
    a first main electrode connected to said semiconductor region;
    a base region of a second conduction type formed on said semiconductor region;
    a diffused region of the first conduction type formed on said base region;
    a second main electrode connected to said diffused region and said base region;
    a first trench formed extending from a surface of said diffused region to said semiconductor region;
    a second trench formed from a center of a bottom of said first trench, the second trench being much deeper than said first trench and being smaller in lateral width than said first trench;
    a gate electrode formed on a side of said first trench via a first insulator film; and
    a protruded electrode formed in said second trench via a second insulator film as protruded downward lower than said gate electrode,
    said protruded electrode being electrically and directly connected to said second main electrode.

2. The semiconductor device according to claim 1, wherein said second insulator film is formed thicker than said first insulator film.

3. The semiconductor device according to claim 1, wherein said protruded electrode is formed only at a position deeper than a region in depth where said gate electrode is formed.

4. The semiconductor device according to claim 1, wherein top of said protruded electrode is formed at a position deeper than top of said gate electrode.

5. The semiconductor device according to claim 1, further comprising a resistance reduction layer of the first conduction type formed in said semiconductor region adjacent to said second trench and having an impurity concentration higher than that in said semiconductor region.

6. The semiconductor device according to claim 1, wherein said protruded electrode has a cross-sectional area perpendicular to the direction of current flowing in a channel, said cross-sectional area formed smaller than said gate electrode.

7. The semiconductor device according to claim 1, wherein said gate electrode and said protruded electrode are composed of polysilicon.

8. The semiconductor device according to claim 1, wherein said semiconductor device is a MOSFET.

9. The semiconductor device according to claim 1, wherein said semiconductor device is an IGBT.

* * * * *